(12) United States Patent
Dixon et al.

(10) Patent No.: US 10,892,256 B2
(45) Date of Patent: Jan. 12, 2021

(54) LIGHT EMITTING DISPLAY SYSTEM HAVING IMPROVED FIRE PERFORMANCE

(71) Applicant: NanoLumens Acquisition, Inc., Peachtree Corners, GA (US)

(72) Inventors: Adam Dixon, Suwanee, GA (US); David Miller, Sautee, GA (US); Wesley Funsch, Elko, GA (US); Drew Meincke, Woodstock, GA (US); Jorge Perez-Bravo, Alpharetta, GA (US)

(73) Assignee: Nanolumens Acquisition, Inc., Peachtree Corners, GA (US)

( * ) Notice: Subject to any disclaimer, the term of this patent is extended or adjusted under 35 U.S.C. 154(b) by 208 days.

(21) Appl. No.: 16/260,339

(22) Filed: Jan. 29, 2019

(65) Prior Publication Data

US 2019/0237447 A1    Aug. 1, 2019

Related U.S. Application Data

(60) Provisional application No. 62/624,468, filed on Jan. 31, 2018.

(51) Int. Cl.
| | |
|---|---|
| *H05K 1/03* | (2006.01) |
| *H01L 25/13* | (2006.01) |
| *H01L 33/48* | (2010.01) |
| *H05K 5/00* | (2006.01) |

(52) U.S. Cl.
CPC ............ *H01L 25/13* (2013.01); *H01L 33/483* (2013.01); *H05K 1/0366* (2013.01); *H05K 1/0373* (2013.01); *H05K 5/0017* (2013.01); *H05K 2201/012* (2013.01); *H05K 2201/029* (2013.01)

(58) Field of Classification Search
CPC ..... H01L 25/13; H05K 1/0366; H05K 1/0373
USPC ........................................................ 313/512
See application file for complete search history.

(56) References Cited

U.S. PATENT DOCUMENTS

| | | | |
|---|---|---|---|
| 5,008,360 | A * | 4/1991 | Bard ....................... C08G 77/50 523/222 |
| 5,747,928 | A | 5/1998 | Shanks et al. |
| 6,332,690 | B1 | 12/2001 | Murifushi |
| 6,819,045 | B2 | 11/2004 | Okita et al. |
| 6,974,971 | B2 | 12/2005 | Young |
| 7,242,398 | B2 | 7/2007 | Nathan et al. |
| 7,636,085 | B2 | 12/2009 | Yang |
| 7,710,370 | B2 | 5/2010 | Slikkerveer et al. |
| 7,714,801 | B2 | 5/2010 | Kimmel |
| 7,825,582 | B2 | 11/2010 | Furukawa et al. |
| 7,834,537 | B2 | 11/2010 | Kee et al. |
| 7,834,962 | B2 | 11/2010 | Satake et al. |
| 7,868,545 | B2 | 1/2011 | Hioki et al. |
| 7,977,170 | B2 | 7/2011 | Tredwell et al. |
| 8,023,060 | B2 | 9/2011 | Lin et al. |
| 8,096,068 | B2 | 1/2012 | Van Rens |
| 8,097,812 | B2 | 1/2012 | Wang et al. |
| 8,098,486 | B2 | 1/2012 | Hsiao |
| 8,228,667 | B2 | 7/2012 | Ma |

(Continued)

*Primary Examiner* — Christopher M Raabe
(74) *Attorney, Agent, or Firm* — Theodore Heske, III (57) ABSTRACT

Disclosed are embodiments of fire resistant display components, systems and associated methods. The system comprises a plurality of light emitting display modules, each display module being constructed to have improved fire resistance as measured by one or more fire performance characteristics including heat release, smoke density, smoke toxicity, flame spread or drip.

18 Claims, 4 Drawing Sheets

(56) References Cited

U.S. PATENT DOCUMENTS

| | | |
|---|---|---|
| 8,284,369 B2 | 10/2012 | Chida et al. |
| 8,319,725 B2 | 11/2012 | Okamoto et al. |
| 8,456,078 B2 | 6/2013 | Hashimoto |
| 8,471,995 B2 | 6/2013 | Tseng |
| 8,477,464 B2 | 7/2013 | Visser et al. |
| 8,493,520 B2 | 7/2013 | Gay et al. |
| 8,493,726 B2 | 7/2013 | Visser et al. |
| 8,654,519 B2 | 2/2014 | Visser |
| 8,780,039 B2 | 7/2014 | Gay et al. |
| 8,816,977 B2 | 8/2014 | Rothkopf et al. |
| 8,873,225 B2 | 10/2014 | Huitema et al. |
| 8,982,545 B2 | 3/2015 | Kim et al. |
| 9,117,384 B2 | 8/2015 | Phillips et al. |
| 9,176,535 B2 | 11/2015 | Bohn et al. |
| 9,286,812 B2 | 3/2016 | Bohn et al. |
| 9,335,793 B2 | 5/2016 | Rothkopf |
| 9,372,508 B2 | 6/2016 | Wang |
| 9,459,656 B2 | 10/2016 | Shai |
| 2006/0098153 A1 | 5/2006 | Slikkerveer et al. |
| 2006/0204675 A1 | 9/2006 | Gao et al. |
| 2007/0241002 A1 | 10/2007 | Wu et al. |
| 2008/0042940 A1 | 2/2008 | Hasegawa |
| 2008/0218369 A1 | 9/2008 | Krans et al. |
| 2009/0189917 A1 | 7/2009 | Benko et al. |
| 2009/0258161 A1 | 10/2009 | Japp et al. |
| 2011/0134144 A1 | 6/2011 | Moriwaki |
| 2011/0207866 A1 | 8/2011 | Japp et al. |
| 2012/0002360 A1 | 1/2012 | Seo et al. |
| 2012/0092363 A1 | 4/2012 | Kim et al. |
| 2012/0313862 A1 | 12/2012 | Ko et al. |
| 2013/0100392 A1 | 4/2013 | Fukushima |
| 2015/0125829 A1 | 5/2015 | Hyman |

\* cited by examiner

LIGHT EMITTING DISPLAY SYSTEM HAVING IMPROVED FIRE PERFORMANCE

CROSS REFERENCE TO RELATED APPLICATIONS

This non-provisional utility application claims the benefit of prior filed U.S. provisional application No. 62/624,468 entitled "Light Emitting Display System With Improved Fire Performance", filed on Jan. 31, 2018. Application No. 62/624,468 is incorporated herein by reference.

STATEMENT REGARDING FEDERALLY SPONSORED RESEARCH OR DEVELOPMENT

Not Applicable.

DESCRIPTION OF ATTACHED APPENDIX

A file entitled "1703_P_US_SupplementalDrawings" containing 116 pages of non-black and white supplemental drawings was submitted concurrent with provisional application No. 62/624,468 and is incorporated herein by reference.

BACKGROUND

Large, light-emitting displays find many uses in public spaces owing to their large size, high resolution, and vivid colors. One can already find large information displays taking on important roles in providing airport, train station and bus station travelers with information relevant to their travels.

An important consideration for any equipment used in a public setting is the set of safety characteristics of the equipment in use. Fire performance of equipment used in a public setting is an important facet of safeguarding the health and welfare of the members of the public. Naturally, it can be understood that improved public safety is a desirable goal. Inventions that promote the interest of public safety are consequently highly sought after and valuable. It is clear therefore that embodiments of the present disclosure that provide light emitting display systems and methods with improved fire resistance are highly desirable and needed.

SUMMARY

The present disclosure is directed to light-emitting display systems and methods of building such system that provide for improved fire resistance. Fire performance is an especially important characteristic when viewed from a public safety perspective. During an emergency situation, a display system may be exposed to flames, smoke, and elevated temperatures. In addition, light emitting display systems in service in public installations may themselves be called upon to provide crucial public safety information in the event of an emergency by providing guidance and information to endangered persons. It is therefore highly desirable that such systems be resistant to flames, smoke and elevated temperatures so that they can continue to serve their public safety role. It is further desirable that light emitting display systems minimize any contribution to the flame and/or smoke already being produced in an emergency event.

A number of different performance metrics are known in the field of fire performance of electronic equipment. Heat release rate, smoke density, drip, flammability, and other fire hazard related metrics may be used to characterize equipment performance.

Standards for flame retardancy properties such as flame spread, heat release, and smoke generation upon burning have become increasingly stringent for articles used in mass transportation such as trains. The European Union has approved the introduction of a new harmonized fire standard for rail applications, namely EN-45545, to replace all currently active different standards in each member state. This standard imposes strict requirements on heat release, smoke density and toxicity, and flame spread properties allowed for materials used in these applications. Smoke density (Ds-4) in EN-45545 is the smoke density after four minutes measured according to ISO 5659-2. Heat release in EN-45545 is the maximum average rate of heat emission (MAHRE) measured according to ISO5660-1. Flame spread in EN-45545 is the critical heat flux at extinguishment (CFE) measured according to ISO 5658-2.

Exemplary embodiment 1 according to an embodiment of the present disclosure is a light emitting display component comprising:

a) a printed circuit board (PCB) substrate comprising a woven fiberglass fabric portion and resin portion;

b) a plurality of light emitting elements fixed on said PCB substrate in a predetermined pattern, said plurality of light emitting elements collectively providing a viewing plane for the viewing of of visual media; each of said plurality of light emitting elements comprising: one or more light emitting devices disposed in a cavity of a rigid outer housing; and an optical encapsulant disposed within said rigid outer housing;

c) a mask component having a plurality of apertures disposed to match said predetermined pattern of light emitting elements, the mask component attached to said substrate such that each light emitting element is visible through a corresponding aperture in the mask component;

d) said light emitting display component having at least one of the following fire performance metrics:

smoke density measured according to ISO 5659-2 T10.01-DS(4) of less than 648;

smoke density measured according to ISO 5659-2 T10.02-VOF(4) of less than 1254;

flame spread measured according to ISO 5658 CFE of higher than 6.20 Kilo-Watts per square meter;

heat release measured according to ISO 5660 of less than 90 Kilo-Watts (MAHRE) per square meter;

heat release measured according to ISO 5660 of less than 246.6 Kilo-Watts (PHRR) per square meter;

mass loss rate measured according to ISO 5660 of less than 7.0 grams per square meter per second;

heat of combustion measured according to ISO 5660 of less than 20.2 Mega-Joules/Kilogram.

Exemplary embodiment 1A comprises exemplary embodiments 1-3 and is further characterized in that the light emitting display component has at least one of the following fire performance metrics:

smoke density measured according to ISO 5659-2 T10.01-DS(4) of about 146 or less;

smoke density measured according to ISO 5659-2 T10.02-VOF(4) of about 151 or less;

flame spread measured according to ISO 5658 CFE of about 21.05 Kilo-Watts per square meter or higher;

heat release measured according to ISO 5660 of about 90 Kilo-Watts (MAHRE) per square meter or less;

heat release measured according to ISO 5660 of about 221 Kilo-Watts (PHRR) per square meter or less;

mass loss rate measured according to ISO 5660 of about 6.5 grams per square meter per second or less;

heat of combustion measured according to ISO 5660 of about 19.2 Mega-Joules/Kilogram or less.

Exemplary embodiment 1B comprises exemplary embodiments 1-3 and is further characterized in that the resin portion comprises less than about 43 percent or less of the mass of the PCB substrate.

Exemplary embodiment 1C comprises exemplary embodiments 1-3 and is further characterized in that the resin portion comprises material having a halogen free formula.

Exemplary embodiment 1D comprises exemplary embodiments 1-3 and is further characterized in that the PCB substrate has a thickness of less than about 1.6 mm.

Exemplary embodiment 1E comprises exemplary embodiments 1-3 and is further characterized in that the woven fiberglass fabric portion of the PCB substrate comprises about 57% or more by mass of said PCB substrate.

Exemplary embodiment 1F comprises exemplary embodiments 1-3 and is further characterized in that the rigid outer housing comprises a halogen free polymer.

Exemplary embodiment 1G comprises exemplary embodiments 1-3 and is further characterized in that the rigid outer housing comprises a PPA polymer.

Exemplary embodiment 1H comprises exemplary embodiments 1-3 and is further characterized in that the optical encapsulant comprises a halogen free material.

Exemplary embodiment 1I comprises exemplary embodiments 1-3 and is further characterized in that the mask comprises a PEI polymer.

Exemplary embodiment 1J comprises exemplary embodiments 1-3 and is further characterized in that the mask comprises a ceramic material.

Exemplary embodiment 2 according to an embodiment of the present disclosure is a light emitting display system comprising a plurality of light emitting display components having improved fire resistance constructed according to any of the previously recited embodiments.

Another exemplary embodiment 3 according to the present disclosure is a light emitting display component having improved fire performance comprising:
  a) a plurality of light emitting elements fixed on a substrate in a predetermined pattern collectively creating a viewing plane for the viewing of visual media;
  b) a mask component having a plurality of apertures disposed to match said predetermined pattern of light emitting elements, the mask component attached to said substrate, each of said light emitting elements visible through a corresponding aperture in said mask component, said mask component comprising a halogen free polymer;
  c) said substrate further characterized in that it comprises a printed circuit board of less than 1.6 mm thickness, the printed circuit board comprising:
    i) a woven fiberglass portion comprising at least 57% by weight of the printed circuit board;
    ii) a resin portion comprising less than about 43% by weight of the printed circuit board, said resin portion having a halogen free formula;
  d) each light emitting element comprising:
    i) a plurality of light emitting devices disposed in a cavity of a rigid outer housing, the rigid housing comprising a halogen free polymer;
    ii) an optical encapsulant disposed within said rigid outer housing, said optical encapsulant encapsulating said plurality of light emitting devices, the optical encapsulant having a halogen free formula;
  e) the light emitting display component further characterized in that it has at least one of the fire performance metrics:
    i) smoke density measured according to ISO 5659-2 T10.01-DS(4) of about 146 or less;
    ii) smoke density measured according to ISO 5659-2 T10.02-VOF(4) of about 151 or less;
    iii) flame spread measured according to ISO 5658 CFE of about 21.05 Kilo-Watts per square meter or higher;
    iv) heat release measured according to ISO 5660 of about 90 Kilo-Watts (MAHRE) per square meter or less;
    v) heat release measured according to ISO 5660 of about 221 Kilo-Watts (PHRR) per square meter or less;
    vi) mass loss rate measured according to ISO 5660 of about 6.5 grams per square meter per second or less;
    vii) heat of combustion measured according to ISO 5660 of about 19.2 Mega-Joules/Kilogram or less.

BRIEF DESCRIPTION OF THE DRAWINGS

These and other features, aspects, and advantages of the present invention will become better understood with regard to the following description, appended claims, and accompanying drawings where:

LIST OF REFERENCE NUMBERS APPEARING IN THE FIGURES

2—light emitting display system
8—coordinate system showing x-axis, y-axis, and z-axis
8X—x-axis 8Xa, 8Xb—first x-axis, second x-axis
8Y—y-axis
8Ya, 8Yb—first y-axis, second y-axis
8Z—z-axis
10—square tile, which is a regular 4 sided polygon
10a, 10b, etc.—first square, second square, etc.
11—pitch distance
12—square tiling of the plane
12v—representative vertex of the square tiling
12s—representative side of the square tiling
14—predetermined pattern corresponding to a tiling of the plane
20—PCB Substrate
22—woven fiberglass fabric
24—resin
30—outer housing
32—optical encapsulant
34a, 34b, etc.—first light emitting device, second light emitting device, etc.
40—support frame
41—support direction
50—mask
51a, 51b, . . . —first mask aperture, second mask aperture, . . .
52—plurality of mask apertures
70—display module
70a, 70b, 70c, . . . —first, second, third, etc. display module
71—light emitting element
71a, 71b, etc.—first, second, etc. light emitting element
72—plurality of light emitting elements
72a, 72b, etc.—first light emitting element, second light emitting element, etc.
74—display plane
74a, 74b—first display plane, second display plane
75—display plane disposed at a first angle with respect to the viewing plane
80—viewing plane Table of Polymers, showing polymer name, ISO/ASTM abbreviation, and average ignition temperature in ° C.

| Polymer | Abbreviation | $T_{ign}$ (° C.) |
|---|---|---|
| Acrylonitrile-butadiene-styrene | ABS | 394 |
| ABS FR | ABS-FR | 420 |
| Polybutadiene | BDR | 378 |
| Polyisobutylene (butyl rubber) | BR | 330 |
| Cellulose Acetate | CA | 348 |
| Cyanate Ester (typical) | CE | 468 |
| Polyethylene (chlorinated) | CPE | — |
| Polyvinylchloride (chlorinated) | CPVC | 643 |
| Polychloroprene rubber | CR | 406 |
| Polychlorotrifluoroethylene | CTFE | 580 |
| Poly(ethylene-chlorotrifluoroethylene) | ECTFE | 613 |
| Phenoxy-A | EP | 444 |
| Epoxy (EP) | EP | 427 |
| Poly(ethylene-tetrafluoroethylene) | ETFE | 540 |
| Polyethylenevinylacetate | EVA | — |
| Fluorinated ethylene propylene | FEP | 630 |
| Poly(styrene-butadiene) | HIPS | 413 |
| Poly(styrene-butadiene) FR | HIPS-FR | 380 |
| Poly(p-phenyleneterephthalamide) | KEVLAR | — |
| Polyarylate (liquid crystalline) | LCP | — |
| Melamine formaldehyde | MF | 350 |
| Polyisoprene (natural rubber) | NR | 297 |
| Polytrifluoroethylene | P3FE | — |
| Polyamide 12 | PA12 | — |
| Polyamide 6 | PA6 | 432 |
| Polyamide 610 | PA610 | — |
| Polyamide 612 | PA612 | — |
| Polyamide 66 | PA66 | 456 |
| Polyamide 6 (glass reinforced) | PA6-G | 390 |
| Polyamideimide | PAI | 526 |
| Polyacrylamide | PAM | — |
| Polyacrylonitrile | PAN | 460 |
| Polyarylate (amorphous) | PAR | — |

Table 1, showing polymer name, ISO/ASTM abbreviation and average ignition temperature in ° C.

| Polymer | Abbreviation | $T_{ign}$ (° C.) |
|---|---|---|
| Polybutene | PB | — |
| Polybenzimidazole | PBI | — |
| Polybutylmethacrylate | PBMA | — |
| Polybenzobisoxazole | PBO | — |
| Polybuteleneterephthlate | PBT | 382 |
| Polybutyleneterephthalate | PBT-G | 360 |
| Polycarbonate | PC | 500 |
| Polycarbonate/ABS (70/30) | PC/ABS | 440 |
| Polycarbonate (glass reinforced) | PC-G | 420 |
| Polycaprolactone | PCL | — |
| Polyethylene (high density) | PE HD | 380 |
| Polyethylene (low density) | PE LD | 377 |
| Polyethylacrylate | PEA | — |
| Polyethylene-acrylic acid salt | PEAA | — |
| Polyetheretherketone | PEEK | 570 |
| Polyetherimide | PEI | 528 |
| Polyetherketone (e.g., KADEL) | PEK | — |
| Polyetherketoneketone | PEKK | — |
| Polyethylmethacrylate | PEMA | — |
| Polyethylenenaphthalate | PEN | 479 |
| Polyethyleneoxide | PEO | — |
| Polyethersulfone | PESU | 502 |
| Polyethyleneterephthlate | PET | 407 |
| Phenol formaldehyde | PF | 429 |
| Polytetrafluoroethylene-perfluoroether | PFA | — |
| Phenol formaldehyde | PF-G | 580 |
| Polymethylmethacrylate | PMMA | 317 |
| Poly(4-methyl-1-pentene) | PMP | — |
| Poly(α-methyl)styrene | PMS | — |
| Poly(α-methylstyrene) | PMS | — |
| Polyoxymethylene | POM | 344 |
| Polypropylene | PP | 367 |
| Polypropylene (isotactic) | PP (iso) | — |
| Polyphthalamide (AMODEL) | PPA | — |
| Polyphenyleneether | PPE | 426 |
| Poly(2,6-dimethylphenyleneoxide) | PPO | 418 |
| Polypropyleneoxide | PPOX | — |
| Polyphenylenesulfide | PPS | 575 |
| Polyphenylsulfone | PPSU | 575 |
| Polystyrene | PS | 356 |
| Polysulfone | PSU | 510 |
| Polytetrafluoroethylene | PTFE | 630 |
| Polytetramethyleneoxide | PTMO | — |
| PU (isocyanurate/rigid) | PU | 378 |
| Polyetherurethane rubber | PUR | 356 |
| Polyvinylacetate | PVAC | — |
| Polyvinylbutyral* | PVB | — |
| Polyvinylchloride (50% DOP) | PVC (flex) | 318 |
| Polyvinylchloride (rigid) | PVC (rigid) | 395 |
| Polyvinylchloride/polyvinylacetate blend | PVC/PVAC | — |
| Polyvinylidenechloride | PVDC | — |
| Polyvinylidenefluoride | PVDF | 643 |
| Polyvinylfluoride | PVF | 476 |
| Polyvinylcarbazole | PVK | — |
| Polyvinylalcohol | PVOH | — |
| Polyvinylpyridine | PVP | — |
| Polypara(benzoyl)phenylene | PX | — |
| Poly(styrene-acrylonitrile) | SAN | 368 |
| Phenylsilsesquioxane (silicone) Resin | SI | — |
| Silicone Rubber | SIR | 407 |
| Poly(styrene-maleic anhydride) | SMA | — |
| Polyimide thermoplastic | TPI | 600 |
| Polyurethane thermoplastic | TPU | 271 |

-continued

| Polymer | Abbreviation | $T_{ign}$ (° C.) |
|---|---|---|
| Unsaturated Polyester | UPT | 380 |
| Unsaturated Polyester | UPT-G | 395 |

Description

Embodiments of the present disclosure provide systems and methods of building light emitting displays having improved fire resistance. The systems and methods disclosed herein provide for improved heat release, smoke density, smoke toxicity, and flame spread as compared to conventional display systems.

Standard light emitting displays of both indoor and outdoor construction types do not meet stringent building materials fire hazard standards required by most transportation authorities. Applicants have confirmed this with internationally accredited lab testing of a wide spectrum of standard and leading-edge homogeneous polymer materials and heterogeneous display construction tests.

It is known in the art that the fire performance of a heterogeneous combination of materials is unpredictable. Applicants therefore undertook a creative, but nevertheless painstaking, process of selection and testing of materials and of selection and testing of methods of making the light emitting display modules of this disclosure. Those efforts resulted in significant improvements in heat release, smoke density, smoke toxicity, and flame spread of the resulting light emitting display modules in comparison to the prior state of the art. Various embodiments of the present disclosure provide improved light emitting display modules with improved fire performance. The improvements achieved may be measured by one or more of the following test regimes: ISO 5660-1 (Heat Release); ISO 5658-2 (Flame Spread); ISO 5659-2 (Smoke Density and Toxicity); EN45545-2 (Flame Spread, Heat Release, Toxicity); ISO 11925-2 (Ignitability); CA 133 (Furniture Test); BSS 7239 (Boeing Gas Toxicity); BSS 7238 (Smoke Density); BS 6853 (Toxicity); ASTM E 662 (Smoke Density); ASTM E162 (Flame Spread); ATM E1354 (Heat Release); EN 45545.

In addition to characterizing fire performance according to test regimes promulgated by the various international, national, and industry standards setting groups, other characterizations may be described and understood with reference to specific performance characteristics including, but not limited to: ignitability; heat release; mass loss; smoke release; toxic gas release; corrosive products release. Additionally, performance characteristics may be further defined by rate, such as the average heat release rate, and further defined by physical properties such as mass, volume and/or area, such as the average heat release per square meter of display surface.

To further facilitate the present description, and with reference to FIGS. 1A-1H, it will be useful now to turn to the construction of a display according to various embodiments of the present disclosure. Tessellation of a planar surface is the tiling of the plane using one or more geometric shapes, called tiles, creating no gaps and no overlaps. A periodic tiling has a repeated geometric pattern. A regular tiling is a tiling in which all tiles are regular polygons having the same size and shape. Square, triangular, and hexagonal tilings are each an example of a regular, periodic tiling that can achieve a tessellation of a planar surface without gaps or overlaps. Tilings are of special interest in the construction of modular displays because their properties enable the construction of large displays with desirable properties. Assembling a plurality of smaller display modules in which each display module is configured to have a size, shape, and orientation corresponding to a predetermined tiling may produce a large display having no gaps and no overlaps between adjacent display modules.

Within a single display module, a plurality of light emitting elements may be arranged in a predetermined pattern derived from an appropriately configured tiling. A planar tiling of regular polygons consists of edges and vertexes. The set of vertexes of a regular polygon tiling can be seen to create a pattern with a high degree of regularity. A highly uniform visual effect may be produced by placing a light emitting element at or about each of the vertexes of a regular polygon tiling.

Light emitting elements of the present disclosure may each comprise a single light emitting device or multiple light emitting devices. A preferred light emitting element combines red, blue, and green light emitting devices within one light emitting element so as to provide full color spectrum display. Monochrome and other combinations of devices may be used still within the spirit and scope of this disclosure. In other embodiments a light emitting element may comprise white, red, blue and green devices within a single light emitting element. In other embodiments a light emitting element may comprise red, green, blue and cyan devices. In other embodiments a light emitting element may comprise red, green, blue, yellow, and cyan devices, or any combination of devices emitting at different colors within a single light emitting element. In other embodiments multiple devices emitting at substantially the same color may be used.

In creating a uniform visual effect, it is useful to consider a property called pitch distance, which is the distance between any light emitting element and its closest adjacent light emitting elements. It can be seen that a highly uniform visual effect is produced by maintaining a highly uniform pitch throughout a single display module and across a plurality of adjacent display modules. Preferred embodiments of the present disclosure use light emitting elements located at or about the vertexes of a regular polygon tiling. A regular square tiling is one such preferred tiling, producing a uniform visual effect by providing uniform spacing between both rows and columns of light emitting elements. The spacing between adjacent rows and between adjacent columns of a regular square tiling may be referred to as the pitch of that pattern. In such a square tiling, it can be seen that any light emitting element will have at least two closest adjacent neighboring elements that are spaced apart from each other by a distance close to or substantially equal to the pitch distance.

In addition to uniform pitch within a single display module, the spacing between display modules can be controlled so that uniform pitch of light emitting elements is maintained across a plurality of assembled display modules. A preferred embodiment is to provide a display module with a perimeter region of a predetermined width containing no light emitting elements. The preferred width of the perimeter region is less than or about equal to one half of the pitch distance, when measured inward and along the edges of the regular polygon tiling defining the location of the plurality of the light emitting elements. When two display modules are assembled adjacent to one another, each module may provide a perimeter region width of about one half of the pitch, which cumulatively creates a pattern of uniform pitch spanning both modules. A plurality of display modules may thereby be assembled to create uniform pitch spanning the plurality of display modules.

A single display module may comprise a plurality of light emitting elements coupled to a substrate, and arranged in a predetermined pattern corresponding to the vertexes of a regular polygon tiling. The display module has a perimeter. A plurality of display modules may be assembled such that a portion of the perimeter of each display module abuts a portion of the the perimeter of at least one other display module, each module positioned to maintain uniform pitch spacing across the plurality of display modules.

Light emitting display modules may be improved for fire resistance through redesign and through modifications and substitutions of materials used. Modern electronics, and in particular modern light emitting display components and systems, make substantial use of polymers in their construction. Standard construction materials may be significantly improved upon by choosing a heterogeneous mixture of materials that collectively perform better than the standard construction.

Because of the prevalence of solid polymers in the construction of light emitting display modules, it is helpful to better understand their fire behavior. The basic thermal degradation mechanism leading to volatile fuel generation in polymers involves primary and secondary decomposition events. The primary decomposition step can be main-, end-, or side-chain scission of the polymer. Subsequent thermal degradation reactions depend largely on the chemical structure of the polymer but typically proceed by hydrogen transfer to $\alpha$- or $\beta$-carbons, nitrogen or oxygen, intra-molecular exchange (cyclization), side-chain reactions, small-molecule ($SO_2$, $CO_2$, and $S_2$) elimination, molecular rearrangement, or unzipping to monomer. Unzipping or depolymerization of vinyl polymers is characterized by a kinetic chain length or zip length that is the average number of monomer units produced by a decomposing radical before the radical is deactivated by termination or transfer. Mathematically, the zip length is the ratio of the rate constants for initiation to termination.

Aromatic backbone polymers such as polycarbonate, polyimides, polyaramides, polyarylsulfones, and polyphenyleneethers tend to decompose in varying degrees to a carbonaceous char residue through a complex set of intra-molecular rearrangements and side-chain reactions involving cross-linking and bond scission. The char yield is the mass fraction of carbonaceous char that remains after flaming combustion of the polymer. Charring competes with termination reactions that generate volatile species, thus reducing the amount of available fuel in a fire. In addition, char acts as a heat and mass transfer barrier that lowers the flaming heat release rate (HRR). Char yield in a fire is roughly equal to the anaerobic pyrolysis residue at high (flame) temperatures. Polymers that contain heterocyclic or aromatic structures in the backbone tend to form char during thermal decomposition in rough proportion to the carbon/hydrogen (C/H) ratio of the polymer. High C/H ratios favor termination by crosslinking between carbon radicals and char is formed. Low C/H ratios favor termination of carbon radicals by hydrogen transfer, resulting in low molecular weight fuel species rather than char. The relative rates of inter-molecular cross-linking and aromatization and intra-molecular hydrogen transfer and cyclization reactions will determine the char yield at any particular hydrogen mole fraction.

Summary of selected fire performance data for a number of relevant of polymers, Table 2 shows Polymer, Heat of Combustion (HOC) (in kilo-Joules per gram), Flaming Combustion Efficiency X:

| Polymer | HOC | X | Polymer | HOC | X |
|---|---|---|---|---|---|
| CEN | 20.6 | 1.00 | CEE | 25.1 | 0.99 |
| PMMA | 24.8 | 0.99 | PP | 41.9 | 0.97 |
| PE LD | 40.3 | 0.97 | PUR | 24.0 | 0.97 |
| PE HD | 40.3 | 0.97 | CET | 25.9 | 0.96 |
| PAI | 15.3 | 0.96 | CR | 17.6 | 0.95 |
| CEM | 28.9 | 0.94 | PEI | 21.8 | 0.94 |
| CEA | 25.9 | 0.94 | UPT | 23.4 | 0.94 |
| POM | 14.4 | 0.94 | TPU | 23.5 | 0.93 |
| PPA | 24.2 | 0.92 | CEF | 16.9 | 0.92 |
| PA66 | 25.2 | 0.92 | PEEK | 21.3 | 0.92 |
| PBT | 21.7 | 0.91 | PSU | 20.4 | 0.91 |
| PC | 21.2 | 0.91 | PEN | 22.9 | 0.91 |
| PPZ | 15.0 | 0.90 | PESU | 22.4 | 0.90 |
| PA6 | 25.8 | 0.90 | PPSU | 23.5 | 0.87 |
| PPS | 25.4 | 0.87 | PBI | 22.0 | 0.83 |
| SBR | 31.5 | 0.83 | EVA | 30.8 | 0.81 |
| NR | 30.2 | 0.80 | SIR | 21.7 | 0.80 |
| PPO/PS | 21.3 | 0.79 | ABS | 29.0 | 0.79 |
| EPDM | 29.2 | 0.77 | CTFE | 6.5 | 0.76 |
| HIPS | 28.1 | 0.76 | EP | 20.4 | 0.75 |
| PET | 18.0 | 0.75 | LCP | 14.8 | 0.72 |
| CPE (25% Cl) | 22.6 | 0.72 | VE | 22.0 | 0.71 |
| ETFE | 7.3 | 0.68 | PS | 27.9 | 0.66 |
| PU | 16.3 | 0.64 | PX | 20.0 | 0.64 |
| PVC (flexible) | 11.3 | 0.59 | PTFE | 4.6 | 0.55 |
| PVC (rigid) | 9.3 | 0.50 | PS-FR | 13.8 | 0.42 |
| CPE (36% Cl) | 10.6 | 0.40 | TPI | 12.0 | 0.38 |
| ABS-FR | 10.2 | 0.38 | PVDF | 3.8 | 0.36 |
| CPE48% Cl | 7.2 | 0.36 | ECTFE | 4.6 | 0.34 |
| CPVC | 3.9 | 0.30 | PVF | 4.1 | 0.22 |
| FEP | 1.3 | 0.17 | | | |

With respect to the polymer materials included in Table 2, flaming combustion efficiency rarely exceeds 99% and typically ranges from 50% to 95%. Smoke is a combination of complete combustion ($CO_2$, $H_2O$, and acid gases) and incomplete combustion (soot, carbon monoxide, and partially oxidized fuel gases) by-products that occur when combustion inhibitors are present, oxygen concentration is low, or there is insufficient reaction time or temperature in the combustion zone. The composition of smoke is highly dependent on the chemical composition of the polymer and the ventilation conditions under which the polymer is burning. Acid gases are irritating to the eyes and nasal passages, which makes escape, in the case of emergency, more difficult. Carbon monoxide is the primary toxic compound in smoke. Soot absorbs light, which limits visibility and increases the luminosity or radiant power of the fire. Smoke is considered to be the main fire hazard but it depends on ventilation and the burning rate of the polymer; therefore, it is the latter quantity, i.e., the burning or heat release rate (HRR), that is considered to be the primary indicator of a fire hazard.

Referring now to Table 3, shown is HHR (in kilo-Watt per Meter squared) for a selection of polymers.

| Polymer | HHR | Polymer | HHR |
|---|---|---|---|
| HIPS | 510 ± 77 | PP | 369 ± 79 |
| PET | 424 ± 168 | PS | 410 ± 66 |
| ABS | 359 ± 66 | PBT | 341 ± 106 |
| PE (chlorinated) | — | UPT | 261 ± 105 |
| PC/ABS | 259 ± 43 | PA66 | 240 ± 59 |
| PMMA | 217 ± 47 | PS-FR | 205 ± 27 |
| PPO/PS | 192 ± 22 | PA6 | 187 ± 55 |
| PC/ABS-FR | 178 ± 36 | VET | 169 ± 44 |
| PESU | 168 ± 23 | HIPS-FR | 164 ± 30 |
| POM | 162 ± 30 | EP | 160 ± 46 |
| PE | 145 ± 93 | PBT-FR | 141 ± 130 |
| CEA | 112 ± 22 | ABS-FR | 117 ± 33 |
| HIPS-FR | 114 ± 36 | PVC (flex) | 91 ± 19 |

-continued

| Polymer | HHR | Polymer | HHR |
| --- | --- | --- | --- |
| SIR (filled) | 90 ± 13 | PC | 89 ± 32 |
| PEN | 57 ± 13 | ETFE | 44 ± 31 |
| PVC (rigid) | 9 ± 25 | CR | — |
| KEVLAR | — | UPT-FR | −31 ± 10 |
| CPVC | −34 ± 9 | PE (x-linked)-FR | −38 ± 28 |
| PAI | −64 ± 16 | PPSU | −83 ± 25 |
| PTFE | −84 ± 9 | PEEK | −94 ± 20 |
| NOMEX | — | PEI | −113 ± 19 |
| ECTFE | −127 ± 6 | PPS | −147 ± 30 |
| PBI | −150 ± 36 | PC-FR | −191 ± 51 |
| FEP | — | | |

The chemical pathway to soot formation is a recombination of aromatic radical fragments in the fuel-rich region inside the flame. Minute (10-100 nanometers in diameter) polycyclic, aromatic hydrocarbon particles are formed. These elementary soot particles may oxidize in the combustion zone of the flame. However, the elementary soot particles will agglomerate and grow in size until they are large enough to interact with visible light (0.3-0.7 micrometers), ultimately reaching sizes on the order of a micron that absorb infrared radiation. Smoke is a combination of these soot particles in an aerosol with unburned liquid hydrocarbons, carbon dioxide/monoxide, water, and halogen acid gases, if present in the burning polymer.

A light emitting display system having improved fire performance according to the present disclosure may be constructed by assembling a plurality of display modules onto a support frame, the support frame having been previously constructed. In order to arrive at a light emitting display module having improved fire resistance, at least one subsystem and its associated components must be improved over conventional constructions. A variety of subsystems may be improved by the embodiments, methods and principles disclosed herein.

Figures 1A, 1B, 1C, 1D, 1E, 1F, 1G, 1H:
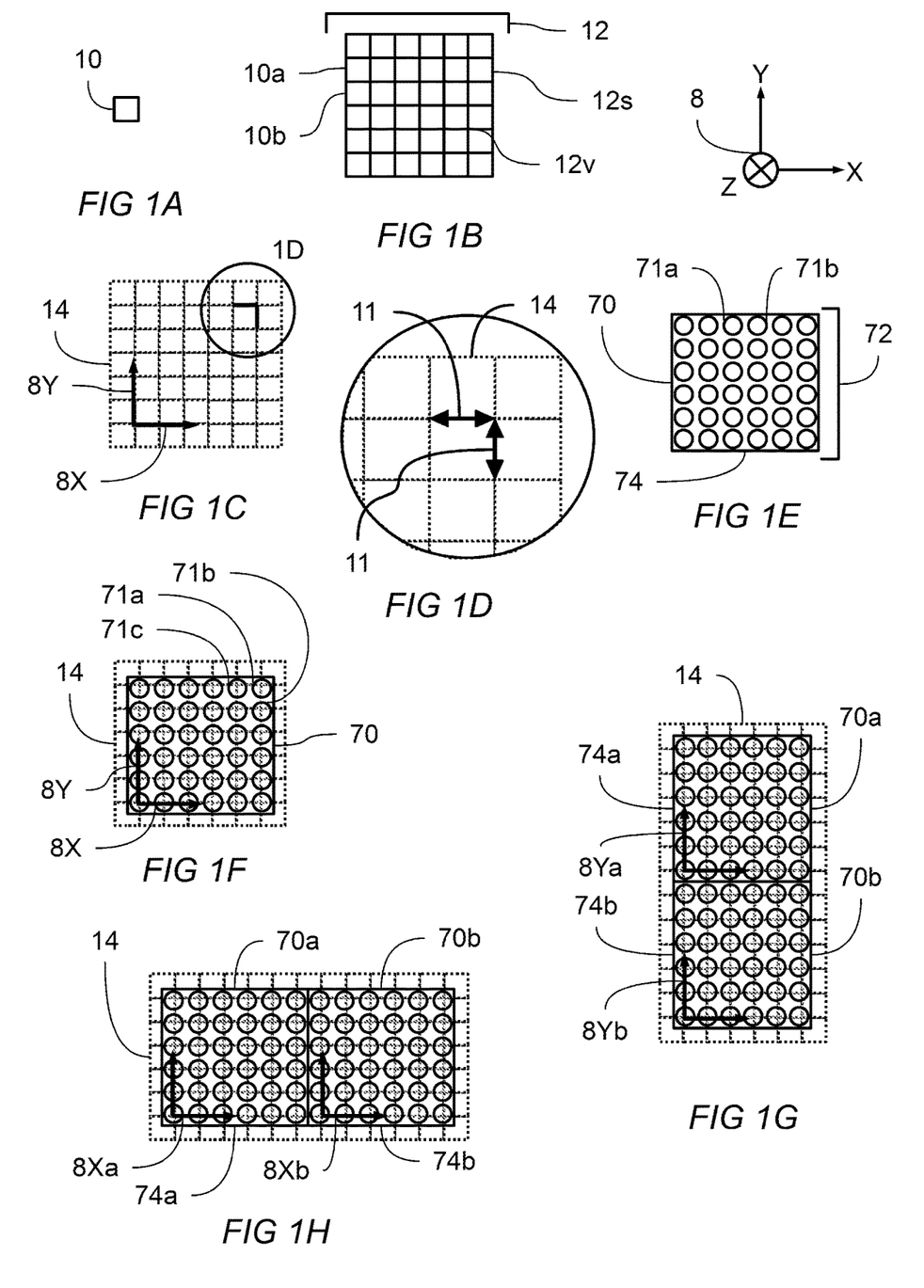
FIG. 1A shows a square consistent with a regular four sided polygon.
FIG. 1B shows a square tiling of a two dimensional plane
FIG. 1C shows coordinate axis defined on square tiling. Enlarged view 1D is indicated
FIG. 1D shows an enlarged view of the indicated region of FIG. 1C showing uniform row and column pitch distance.
FIG. 1E shows a plan view of a display module having a plurality of light emitting elements coordinate axis defined on square tiling.
FIG. 1F shows the display module of FIG. 1E overlaid with the predetermined pattern of square tiling and coordinate axes.
FIG. 1G shows a plan view of two display modules aligned along their y-axis.
FIG. 1H shows a plan view of two display modules aligned along their x-axis.

Turning now to FIG. 1A, shown is a regular four sided polygon, also called a square 10, consistent with the square tiling 12 of the two dimensional plane shown in FIG. 1B. A coordinate system 8 is indicated so as to make discussion of geometry features of the present disclosure more clear. Square tiling 12 is comprised of a plurality of square tiles, of which first square 10a and second square 10b are typical, arranged so that no gaps and no overlaps are produced. When arranged into the predetermined pattern shown in FIG. 1B, the square tiling 12 can be seen to create a plurality of vertex 12v and a plurality of side 12s, in which every vertex 12v is separated a distance of about 12s from each of its closest neighboring vertexes.

FIG. 1C shows predetermined pattern corresponding to a tiling of the plane 14 according to a square tiling. Overlaid onto the predetermined pattern corresponding to a tiling of the plane 14 are x-axis 8X and y-axis 8Y, showing that a coordinate system can be overlaid onto the the predetermined pattern to facilitate clear disclosure of the location and alignment of other features to be described. The enlarged section, denoted FIG. 1D, shows that the square tiling of the plane gives rise to a highly uniform spacing of vertexes, which can be characterized as pitch distance 11. Pitch distance 11 corresponding to the predetermined pattern 14 gives rise to uniform spacing between rows and columns when that predetermined pattern is based upon a square tiling. It can be seen that row spacing and column spacing are both about equal to the pitch distance 11.

Turning now to FIG. 1E, shown is a display module 70 having a plurality of light emitting elements 72, of which first light emitting element 71a and second light emitting element 71b are individual members of the plurality. Plurality of light emitting elements 72 is shown arranged according to a predetermined pattern so as to create a highly uniform visual effect upon display plane 74. FIG. 1F shows how predetermined pattern 14 according to a square tiling of the plane may be used to position individual light emitting elements 71a, 71b, and 71c according to the location of the vertexes of said predetermined pattern 14. Superimposed upon the plurality of light emitting elements are x-axis 8X and y-axis 8Y. The display module 70 of FIG. 1F comprises a plurality of light emitting elements, each of which may be a single light emitting device or multiple light emitting devices. A preferred light emitting element combines red, blue, and green light emitting devices within one light emitting element so as to provide full color spectrum display. Monochrome and other combinations of devices may be used still within the spirit and scope of this disclosure. The display modules of FIG. 1E and FIG. 1F each have a region adjacent to their perimeter that is free from light emitting elements. This enables close spacing of adjacent modules as will now be seen.

FIG. 1G shows a first display module 70a adjacent to a second display module 70b and disposed so that their display planes 74a and 74b abut and their respective y-axes 8Ya and 8Yb are substantially aligned, thereby creating a highly uniform visual effect that spans the combined display modules. A pitch distance can be defined between adjacent light emitting elements between adjacent display modules that is substantially equal to the pitch distance between adjacent light emitting elements within a single display module.

FIG. 1H shows a first display module 70a adjacent to a second display module 70b and disposed so that their respective display planes 74a and 74b abut and their respective x-axes 8Xa and 8Xb are substantially aligned, thereby creating a highly uniform visual effect that spans the combined display modules. A pitch distance can be defined between adjacent light emitting elements between adjacent display modules that is substantially equal to the pitch distance between adjacent light emitting elements within a single display module. When abutted and aligned in the foregoing manner, two adjacent modules may be combined such that their combined plurality of light emitting elements are disposed upon a single predetermined pattern 14 defining a regular tiling of the plane.

FIG. 1G and FIG. 1H make it clear that a large display may be constructed from display modules designed according to the teaching of FIG. 1A-FIG. 1H. Such a large display will tile the two dimensional plane without gaps and without overlaps and produce a highly uniform visual effect. Any number of display modules may be combined in both x and y directions to make a large display that is substantially free from visual aberrations.

Figure 2A:
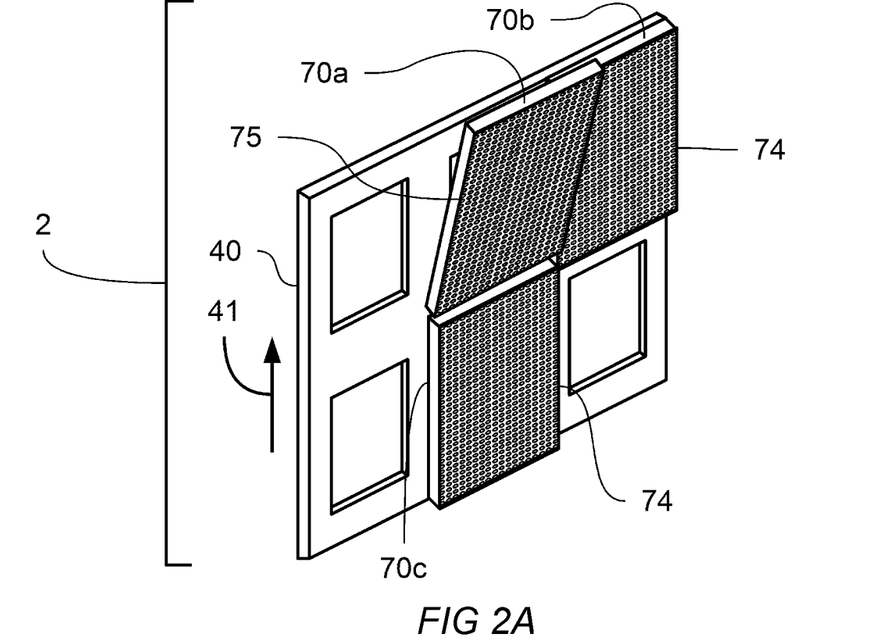
FIG. 2A shows a perspective view of a system of display modules installed on a support frame. One display module is shown in the midst of being either installed or removed.
Figure 2B:
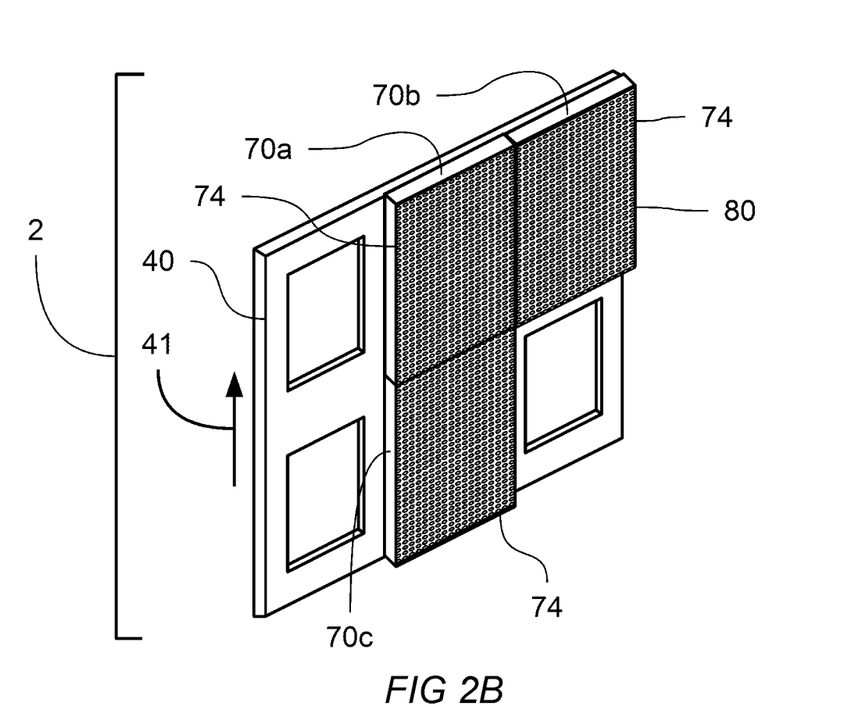
FIG. 2B shows a perspective view of a system of display modules installed on a support frame. Three installed modules are shown collectively creating a viewing plane.

FIG. 2A and FIG. 2B show perspective views of a light emitting display system 2 comprising a plurality of display modules 70a, 70b, 70c installed on a support frame 40, consistent with the display modules described previously, however, the drawing is simplified for clarity. First display module 70a of FIG. 2A is shown with display plane 75 tilted at angle with respect to the collectively established viewing plane of the previously installed display modules, second display module 70b and third display module 70c. When first display module 70a is moved to an installed position, alignment and complementary alignment features are moved to become operatively engaged for establishing and maintaining alignment between the display planes of adjacent display modules. The display planes of first, second, and third display modules, 70a, 70b, and 70c, respectively, are urged to remain aligned and substantially co-planar by means of the action of multiple alignment features. Viewing plane 80 is thereby created without visible gaps between display modules or other visual aberrations.

Figure 3:
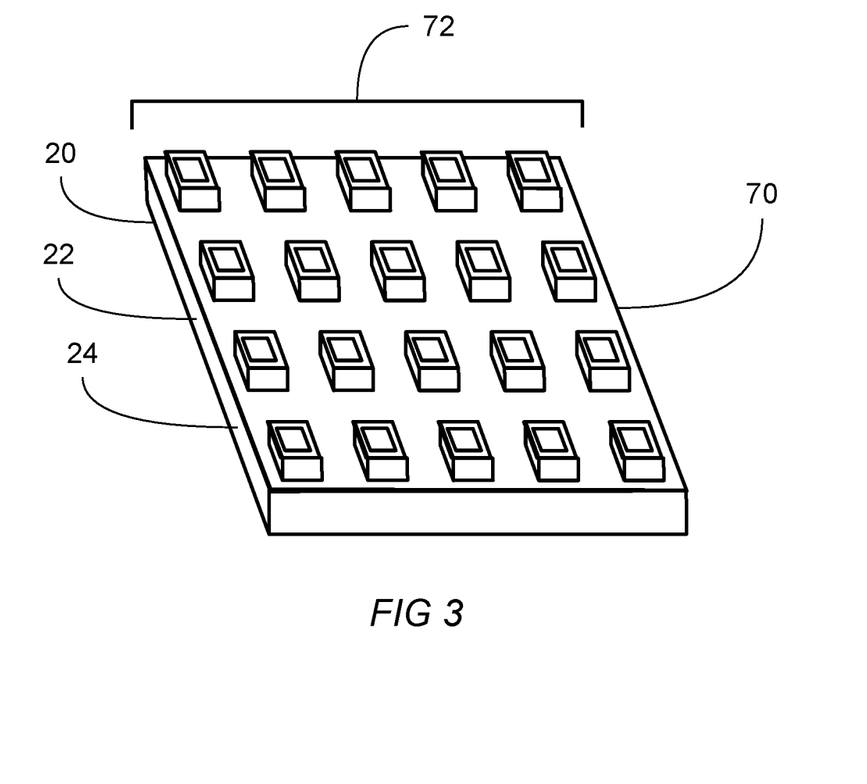
FIG. 3 shows a perspective view of a portion of a light emitting display component.

Turning now to FIG. 3, shown is a close up perspective view of a portion of a light emitting display module 70. A plurality of light emitting elements 72 is shown disposed in a predetermined pattern on printed circuit board (PCB) substrate 20. PCB substrate 20 comprises at least woven fiberglass fabric 22 and binder or resin 24. PCB substrate 20 provides both electrical and mechanical functionality. At least a portion of PCB substrate 20 functions electrically as a printed circuit board (PCB), providing for the attachment of said plurality of light emitting elements 72 on a display side, providing for the attachment of driving circuitry on a back side or the front side, and providing electrical interconnection between display side and back side.

Figure 4A:
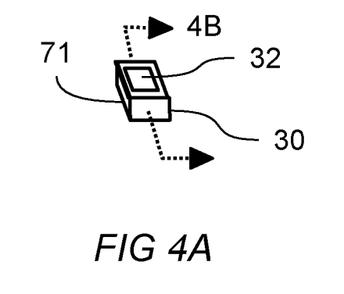
FIG. 4A shows a perspective view of a light emitting element.
Figure 4B:
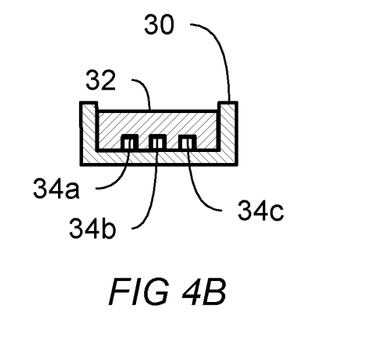
FIG. 4B shows a cross section view of the light emitting element as indicated in FIG. 4A.

With respect now to FIG. 4A and FIG. 4B, each light emitting element 71 comprising the plurality of light emitting elements of FIG. 3 may comprise one or more light emitting devices 34a, 34b, 34c disposed within an outer housing 30. The outer housing also may have metal leads that facilitate both electrical and mechanical connection to the substrate. An optically translucent or transparent optical encapsulant 32 may be used within a portion of outer housing 30 to isolate the light emitting devices 34a, 34b, 34c from the environment while allowing emitted light to escape to the viewer of the display. Typical optical encapsulant materials for this application include silicone and epoxy materials.

Figure 5:
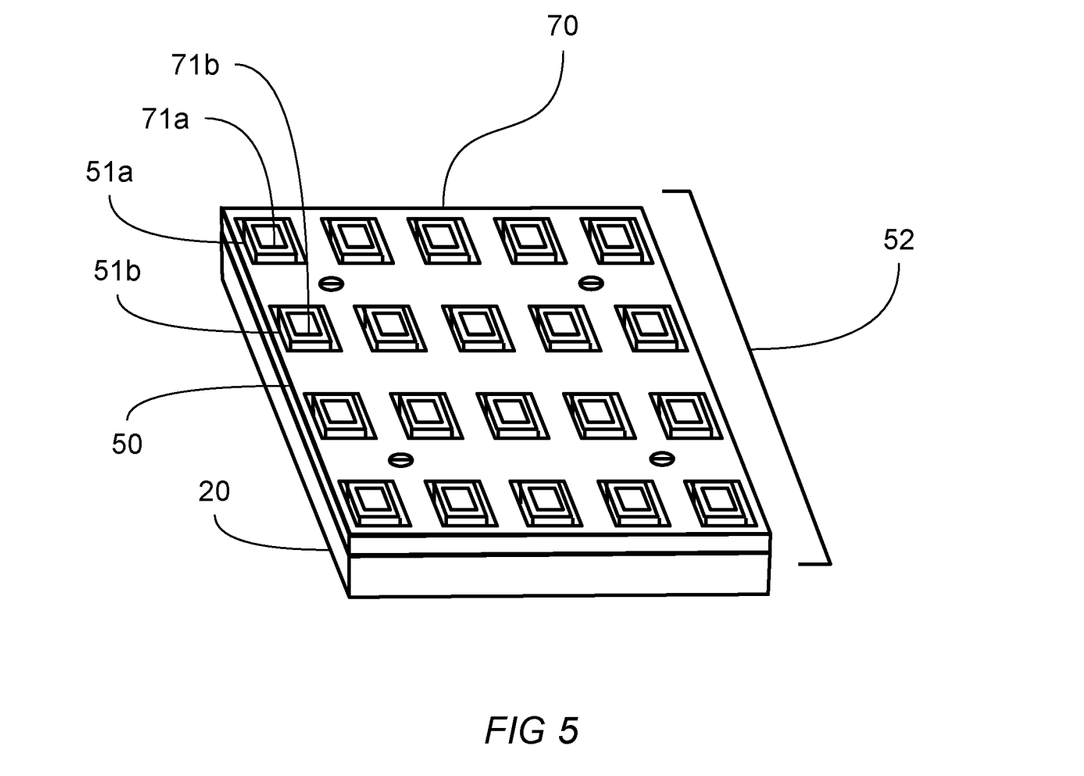
FIG. 5 shows a perspective view of a portion of a light emitting display component having a mask component.

FIG. 5 shows mask 50 secured to the PCB substrate 20 of display module 70. Mask 50 is shown having a plurality of mask apertures 52 arranged in a predetermined pattern. The plurality of apertures of the mask is disposed to match the pattern of light emitting elements so that at least a portion of the outer housing of each light emitting element is disposed so that light may be emitted through a matching aperture in mask 50. FIG. 5 shows a first mask aperture 51a aligned with a first light emitting element 71a and a second mask aperture 51b aligned with a second light emitting element 71b. Mask 50 is preferably dark or black in color, and non-reflective, thereby improving the contrast ratio of the display when seen in environments having at least some ambient light. A typical materials for mask 50 include silicone and polycarbonate, which have poor performance with respect to fire hazard.

The fire resistance of the mask 50 of light emitting display module 70 may be improved by at least one of: using a low heat release polymer; using a PEI polymer; using a PEI polymer having a peak heat release rate of less than about 16 KiloWatt per square meter; using a PEI polymer formulated as ULTEM 9075 or ULTEM 1000; using a non-polymer material having low heat release; using a ceramic material; using a mask of reduced thickness.

Display systems of the current disclosure contain printed circuit boards (PCBs). A PCB may comprise a substrate constructed from woven fiberglass fabric strengthened and bound together with epoxy resin. When cured, the resin hardens thereby stiffening the composite PCB structure. The chemical composition of the resin in a PCB also influences the fire performance of the PCB. Applicants have found that, compared to standard resin, using a resin having a halogen-free formulation reduces the combustion energy, heat release rate, and the release of toxic gasses in tests of fire performance.

Most PCBs are composed of 1 to 16 conductive layers separated and supported by layers (substrates) of insulating material. In a typical four-layer board design, internal layers are used to provide power and ground connections with all other circuit and component connections made on the top and bottom layers of the board. The more complex board designs have a large number of layers necessary for different voltage levels, ground connections, and circuit package formats.

The basic layer of the PCB is a woven fiberglass mat embedded with a flame-resistant epoxy resin. A layer of copper is often placed over this fiberglass/epoxy layer, using methods such as silk screen printing, photoengraving, or PCB milling to remove excess copper. Various conductive copper and insulating dielectric layers are then bonded into a single board structure under heat and pressure. The layers are connected together through drilled holes called vias, typically made with laser ablation or with tiny drill bits made of solid tungsten carbide. The drilled holes can then be plated with copper to provide conductive circuits from one side of the board to the other.

Next, the outer surfaces of a PCB may be printed with line art and text using silk screening. The silk screen print can indicate component designators, switch setting requirements, test points, and other features helpful in assembling, testing, and servicing the circuit board. PCBs intended for extreme environments may also be given a conformal coating made up of dilute solutions of silicone rubber, polyurethane, acrylic, or epoxy, which is applied by dipping or spraying after the components have been soldered. This coat will prevent corrosion and leakage currents or shorting due to condensation.

Weaving technology as applied to fiberglass fabric is essentially the same as it is for any fabric. The warp yarn runs the length of the fabric roll while the fill yarn runs the width. Fiberglass fabric may be manufactured according to a wide variety of weaves having different properties of: fiberglass thickness, pitch, warp yarn, fill yarn, and the number of glass fiber strands used. Standard low cost weaves are 1080 and 2116, having thickness 1.6 mm and retaining from 56%-68% resin by total mass.

Reducing the percentage of resin retained in a PCB substrate, as measured by weight or by volume, results in a reduction of fire susceptibility. Thus a weave configuration may be chosen to reduce the amount of retained resin. In addition, applicants have found that thinner PCB substrates retain less epoxy and therefore are preferred over conventional thicknesses used in the PCB industry.

In order to enhance fire safety performance, additives may be incorporated into a PCB substrate. Selection of flame retardant additives are guided by important factors such as flame retardant effectiveness, electrical and mechanical performance, reliability, cost, and impacts on end-of-life emissions. However, human health and environmental impacts are also important factors in selecting a flame-retardant chemical or formulation to provide fire safety in a PCB.

Reactive flame retardant chemicals that may be added to the PCB substrate may include, but are not limited to: tetrabromobisphenol A (CASRN 79-94-7); DOPO (CASRN 35948-25-5); Fyrol PMP (CASRN 63747-58-0); and others. Reactive flame retardant resins that may infused into the PCB fiberglass fabric may include, but are not limited to: DER 500 Series (CASRN 26265-08-7); Dow XZ-92547; and others. Additive flame retardant chemicals that may be added to the PCB substrate may include, but are not limited to: Aluminum Diethylphosphinate (CASRN 225789-38-8); Aluminum Hydroxide (CASRN 21645-51-2); Magnesium Hydroxide (CASRN 1309-42-8); Melamine Polyphosphate (CASRN 15541-60-3); and Silicon Dioxide (amorphous) (CASRN 7631-86-9), and others.

In a preferred PCB construction, fiberglass weave construction is 7628, having a density of about 2.57 grams per cubic centimeter and an epoxy resin content of about 43% or less by weight, or about 1.125 grams per cubic centimeter or less. In a preferred construction, PCB thickness is about 0.39 centimeters or less.

The outer housing of the plurality of light emitting elements may be improved by at least one of: using a polymer having low heat release; reducing the mass of the outer housing; using a halogen free polymer chemistry; using a halogen-free flame retardant polymer chemistry; using HFFR-4133 polymer chemistry or equivalent; using a polymer having a V-0 rating in the Underwriter's Laboratory database of polymers. Further improvement to the plurality of light emitting elements may be accomplished by using at least one of: reducing the mass of the optical encapsulant; and using an optical encapsulant having a low heat release. One preferred embodiment of a light emitting element comprises: three light emitting devices, one each of red, green and blue; the outer housing consisting of about 16.4 milligrams of PPA, about 6.8 milligrams of epoxy optical encapsulant. Another preferred embodiment of a light emitting element comprises: three light emitting devices, one each of red, green and blue; the outer housing consisting of about 8.0 milligrams of FR-PPA, and about 1.0 milligrams of epoxy optical encapsulant.

Standard light emitting display modules may be compared to improved light emitting display modules constructed according to the present teachings. Representative improvements may be reported according to test results for a variety of fire performance characteristics.

ISO 5659-2: Smoke Density (Lower is Better)
Conventional: T10.01-DS(4)=648; T10.02-VOF(4)=1254
Applicant's Improved System: T10.01-DS(4)=146; T10.02-VOF(4)=151 (ceramic mask)
ISO 5658: Flame Spread (Must Meet CFE>=20 kW/m2, Higher is Better)
Conventional: CFE=6.20 kW/m2
Applicant's Improved System: CFE=21.05 kW/m2 (PEI (Ultem 1000) mask—further improvement with either ceramic or alternate PEI (Ultem 9075) mask)
ISO 5660: Heat Release Rate, Mass Loss Rate, Effective Heat of Combustion (MAHRE) (Lower is Better)
Conventional:
  MAHRE: 90 kW/m2;
  PHRR=246.6 kW/m2;
  Avg Mass Loss Rate: 7.0 g/m2*s;
  HoC: 20.2 MJ/kg
Applicant's Improved System:
  MAHRE: 90 kW/m2;
  PHRR=221 kW/m2;
  Avg Mass Loss Rate: 6.5 g/m2*s;
  HoC: 19.2 MJ/kg
  (PEI (Ultem 1000) mask—further improvement with either ceramic or alternate PEI (Ultem 9075) mask)

Applicants main observations on the test data for the prior paragraphs is that the improved designs produced: 1) Major improvements in Smoke density; 2) Major improvements in Flame Spread (pass/fail 20 kW/m2 threshold); 3) Improvements in heat release rate, mass loss rate and effective heat of combustion with expectation of significant improvement with ceramic mask.

Although the present invention has been described in considerable detail with reference to certain preferred versions thereof, other versions are possible. It may be desirable to combine features shown in various embodiments into a single embodiment. Yet other embodiments may combine the disclosed features in different combinations from the embodiments described as preferred. Therefor, the spirit and scope of the appended claims should not be limited to the description of the preferred versions contained herein.

Any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

What is claimed is:

1. A light emitting display component having improved fire performance comprising:
   a) a plurality of light emitting elements fixed on a substrate in a predetermined pattern collectively creating a viewing plane for the viewing of visual media;
   b) a mask component having a plurality of apertures disposed to match said predetermined pattern of light emitting elements, the mask component attached to said substrate, each of said light emitting elements visible through a corresponding aperture in said mask component, said mask component comprising a halogen free material;
   c) said substrate further characterized in that it comprises a printed circuit board of less than 1.6 mm thickness, the printed circuit board comprising:
   d) a woven fiberglass portion comprising at least 57% by weight of the printed circuit board;
   e) a resin portion comprising less than about 43% by weight of the printed circuit board, said resin portion being a halogen free material;
   f) each light emitting element comprising:
      i) a plurality of light emitting devices disposed in a cavity of a rigid outer housing, the rigid housing comprising a halogen free polymer;
      ii) an optical encapsulant disposed within said rigid outer housing, said optical encapsulant encapsulating said plurality of light emitting devices, the optical encapsulant having a halogen free formula.

2. The light emitting display component of claim 1 further characterized in that it has a smoke density measured according to ISO 5659-2 T10.01-DS(4) of about 146 or less.

3. The light emitting display component of claim 1 further characterized in that it has a smoke density measured according to ISO 5659-2 T10.02-VOF(4) of about 151 or less.

4. The light emitting display component of claim 1 further characterized in that it has a flame spread measured according to ISO 5658 CFE of about 21.05 Kilo-Watts per square meter or higher.

5. The light emitting display component of claim 1 further characterized in that it has a heat release measured according to ISO 5660 of about 90 Kilo-Watts (MAHRE) per square meter or less.

6. The light emitting display component of claim 1 further characterized in that it has a heat release measured according to ISO 5660 of about 221 Kilo-Watts (PHRR) per square meter or less.

7. The light emitting display component of claim 1 further characterized in that it has a mass loss rate measured according to ISO 5660 of about 6.5 grams per square meter per second or less.

8. The light emitting display component of claim 1 further characterized in that it has a heat of combustion measured according to ISO 5660 of about 19.2 Mega-Joules/Kilogram or less.

9. The light emitting display component with improved fire performance of claim 1 further characterized in that the rigid outer housing comprises a PPA polymer.

10. The light emitting display component with improved fire performance of claim 1 further characterized in that the mask comprises a PEI polymer.

11. The light emitting display component with improved fire performance of claim 1 further characterized in that the mask comprises a ceramic material.

12. A light emitting display component having improved fire performance comprising:
   a) a plurality of light emitting elements fixed on a substrate in a predetermined pattern collectively creating a viewing plane for the viewing of visual media;
   b) a mask component having a plurality of apertures disposed to match said predetermined pattern of light emitting elements, the mask component attached to said substrate, each of said light emitting elements visible through a corresponding aperture in said mask component, said mask component comprising a halogen free polymer;
   c) said substrate further characterized in that it comprises a printed circuit board of less than 1.6 mm thickness, the printed circuit board comprising:
   d) a woven fiberglass portion comprising at least 57% by weight of the printed circuit board;
   e) a resin portion comprising less than about 43% by weight of the printed circuit board, said resin portion being a halogen free material;
   f) each light emitting element comprising:
      i) a plurality of light emitting devices disposed in a cavity of a rigid outer housing, the rigid housing comprising a halogen free polymer;
      ii) an optical encapsulant disposed within said rigid outer housing, said optical encapsulant encapsulating said plurality of light emitting devices, the optical encapsulant having a halogen free formula;
   g) the light emitting display component having at least one of the fire performance metrics:
      i) smoke density measured according to ISO 5659-2 T10.01-DS(4) of less than 648;
      ii) smoke density measured according to ISO 5659-2 T10.02-VOF(4) of less than 1254;
      iii) flame spread measured according to ISO 5658 CFE of higher than 6.20 Kilo-Watts per square meter;
      iv) heat release measured according to ISO 5660 of less than 90 Kilo-Watts (MAHRE) per square meter;
      v) heat release measured according to ISO 5660 of less than 246.6 Kilo-Watts (PHRR) per square meter;
      vi) mass loss rate measured according to ISO 5660 of less than 7.0 grams per square meter per second;
      vii) heat of combustion measured according to ISO 5660 of less than 20.2 Mega-Joules/Kilogram.

13. The light emitting display component with improved fire performance of claim 12 further characterized in that it has at least one of the following fire performance metrics:
   a) smoke density measured according to ISO 5659-2 T10.01-DS(4) of about 146 or less;
   b) smoke density measured according to ISO 5659-2 T10.02-VOF(4) of about 151 or less;
   c) flame spread measured according to ISO 5658 CFE of about 21.05 Kilo-Watts per square meter or higher;
   d) heat release measured according to ISO 5660 of about 90 Kilo-Watts (MAHRE) per square meter or less;
   e) heat release measured according to ISO 5660 of about 221 Kilo-Watts (PHRR) per square meter or less;
   f) mass loss rate measured according to ISO 5660 of about 6.5 grams per square meter per second or less;
   g) heat of combustion measured according to ISO 5660 of about 19.2 Mega-Joules/Kilogram or less.

14. The light emitting display component with improved fire performance of claim 12 further characterized in that the rigid outer housing comprises a PPA polymer.

15. The light emitting display component with improved fire performance of claim 12 further characterized in that the mask comprises a PEI polymer.

16. The light emitting display component with improved fire performance of claim 12 further characterized in that the mask comprises a ceramic material.

17. A light emitting display system with improved fire performance, the system comprising:
   a) a plurality of light emitting display modules arranged on a support and collectively creating a display plane for the viewing of visual media;
   b) each light emitting display module comprising:
      i) a plurality of light emitting elements fixed on a substrate in a predetermined pattern collectively creating a viewing plane for the viewing of visual media;
      ii) a mask component having a plurality of apertures disposed to match said predetermined pattern of light emitting elements, the mask component attached to said substrate, each of said light emitting elements visible through a corresponding aperture in said mask component, said mask component comprising a halogen free material;
      iii) said substrate further characterized in that it comprises a printed circuit board comprising a woven fiberglass portion and a resin portion, said woven fiberglass portion comprising by mass more than about 57% of said substrate, said resin portion having a halogen free formula;
      iv) each light emitting element comprising:
         A) a plurality of light emitting devices disposed in a cavity of a rigid outer housing, said rigid outer housing comprising a halogen free material;
         B) an optical encapsulant disposed within said rigid outer housing, said optical encapsulant encapsulating said plurality of light emitting devices, said optical encapsulant comprising a halogen free material;
   c) the light emitting display system having at least one of the fire performance metrics:
      i) flame spread measured according to ISO 5658 CFE of higher than 6.20 Kilo-Watts per square meter;
      ii) heat release measured according to ISO 5660 of less than 90 Kilo-Watts (MAHRE) per square meter;
      iii) heat release measured according to ISO 5660 of less than 246.6 Kilo-Watts (PHRR) per square meter;
      iv) mass loss rate measured according to ISO 5660 of less than 7.0 grams per square meter per second;
      v) heat of combustion measured according to ISO 5660 of less than 20.2 Mega-Joules/Kilogram.

18. The light emitting display system with improved fire performance of claim 17 further characterized in that it has at least one of the fire performance metrics:
   a) flame spread measured according to ISO 5658 CFE of about 21.05 Kilo-Watts per square meter or higher;

b) heat release measured according to ISO 5660 of about 90 Kilo-Watts (MAHRE) per square meter or less;
c) heat release measured according to ISO 5660 of about 221 Kilo-Watts (PHRR) per square meter or less;
d) mass loss rate measured according to ISO 5660 of about 6.5 grams per square meter per second or less;
e) heat of combustion measured according to ISO 5660 of about 19.2 Mega-Joules/Kilogram or less.

* * * * *